US009788431B2

(12) United States Patent
Jin et al.

(10) Patent No.: US 9,788,431 B2
(45) Date of Patent: Oct. 10, 2017

(54) HOUSING, ELECTRONIC DEVICE USING SAME, AND METHOD FOR MAKING SAME

(71) Applicants:SHENZHEN FUTAIHONG PRECISION INDUSTRY CO., LTD., Shenzhen (CN); FIH (HONG KONG) LIMITED, Kowloon (HK)

(72) Inventors: Zheng Jin, Shenzhen (CN); Chang-Hai Gu, Shenzhen (CN); Xiao-Kai Liu, Shenzhen (CN); Yu-Tsai Wang, New Taipei (TW)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 88 days.

(21) Appl. No.: 14/684,990

(22) Filed: Apr. 13, 2015

(65) Prior Publication Data
US 2016/0174403 A1    Jun. 16, 2016

(30) Foreign Application Priority Data
Dec. 11, 2014    (CN) .......................... 2014 1 0754787

(51) Int. Cl.
| H05K 5/00 | (2006.01) |
| H05K 1/18 | (2006.01) |
| B29C 63/00 | (2006.01) |
| B29C 33/38 | (2006.01) |
| H04M 1/02 | (2006.01) |
| B29C 45/14 | (2006.01) |
| B29K 67/00 | (2006.01) |
| B29K 69/00 | (2006.01) |

(Continued)

(52) U.S. Cl.
CPC ......... *H05K 1/181* (2013.01); *B29C 33/3842* (2013.01); *B29C 45/14336* (2013.01); *B29C 63/0073* (2013.01); *H04M 1/0202* (2013.01); *B29K 2023/04* (2013.01); *B29K 2033/12* (2013.01); *B29K 2067/003* (2013.01); *B29K 2067/006* (2013.01); *B29K 2069/00* (2013.01); *B29L 2031/3481* (2013.01)

(58) Field of Classification Search
CPC .... H05K 7/142; H05K 9/0062; H05K 9/0016; G06F 1/184; G06F 1/185; H01L 23/552
USPC .......................... 361/728–730, 752, 796, 800
See application file for complete search history.

(56) References Cited

U.S. PATENT DOCUMENTS 6,881,896 B2 * 4/2005 Ebihara ................ H01L 23/552
174/546
7,911,387 B2 * 3/2011 Hill ........................ H01Q 1/243
343/700 MS (Continued)

FOREIGN PATENT DOCUMENTS

| CN | 101094613 A | 12/2007 |
| CN | 101588722 A | 11/2009 |

(Continued)

*Primary Examiner* — Hung S Bui
(74) *Attorney, Agent, or Firm* — Steven Reiss

(57) ABSTRACT

A housing includes a metal substrate, an adhesive layer formed on the metal substrate, and a resin film formed on the adhesive layer, the metal substrate, the adhesive layer and the resin film cooperatively form a cavity through a stamping process, an internal structure needed by the housing is formed in the cavity through an injection process, and the internal structure is formed on the resin film.

16 Claims, 4 Drawing Sheets

(51) Int. Cl.
    *B29K 33/00*     (2006.01)
    *B29L 31/34*     (2006.01)

(56) References Cited

U.S. PATENT DOCUMENTS

| | | | | |
|---|---|---|---|---|
| 8,455,765 | B2* | 6/2013 | Morimoto | H01L 21/4857 174/251 |
| 8,711,308 | B2* | 4/2014 | Kwak | H01L 51/5275 174/250 |
| 8,853,562 | B2* | 10/2014 | Izawa | H05K 9/0024 156/272.2 |
| 2004/0218400 | A1* | 11/2004 | Egashira | B60Q 1/2607 362/520 |
| 2006/0222868 | A1* | 10/2006 | Mori | B05D 1/08 428/447 |
| 2011/0084579 | A1* | 4/2011 | Chang | B29C 45/14016 312/223.1 |
| 2012/0006090 | A1* | 1/2012 | Ryu | B21D 47/04 72/462 |
| 2012/0045604 | A1* | 2/2012 | Gavel | C09J 7/0282 428/41.8 |
| 2012/0250250 | A1* | 10/2012 | Tatebe | G06F 1/1656 361/679.55 |
| 2013/0224425 | A1* | 8/2013 | Yamazaki | C09J 7/00 428/78 |
| 2015/0140397 | A1* | 5/2015 | Tajima | H01M 2/0275 429/127 |

FOREIGN PATENT DOCUMENTS

| | | |
|---|---|---|
| CN | 103282387 A | 9/2013 |
| CN | 104169749 A | 11/2014 |
| TW | I280918 | 5/2007 |
| TW | 201347985 A | 12/2013 |

* cited by examiner

HOUSING, ELECTRONIC DEVICE USING SAME, AND METHOD FOR MAKING SAME

FIELD

The subject matter herein generally relates to a housing, an electronic device using the housing, and a method for making the housing.

BACKGROUND

Metal housings are widely used for electronic devices such as mobile phones or personal digital assistants (PDAs). However, weight of the metal housings is always heavy, such the electronic devices give users a bad tactile feeling.

BRIEF DESCRIPTION OF THE FIGURES

Implementations of the present technology will now be described, by way of example only, with reference to the attached figures.

DETAILED DESCRIPTION

Figure 1:
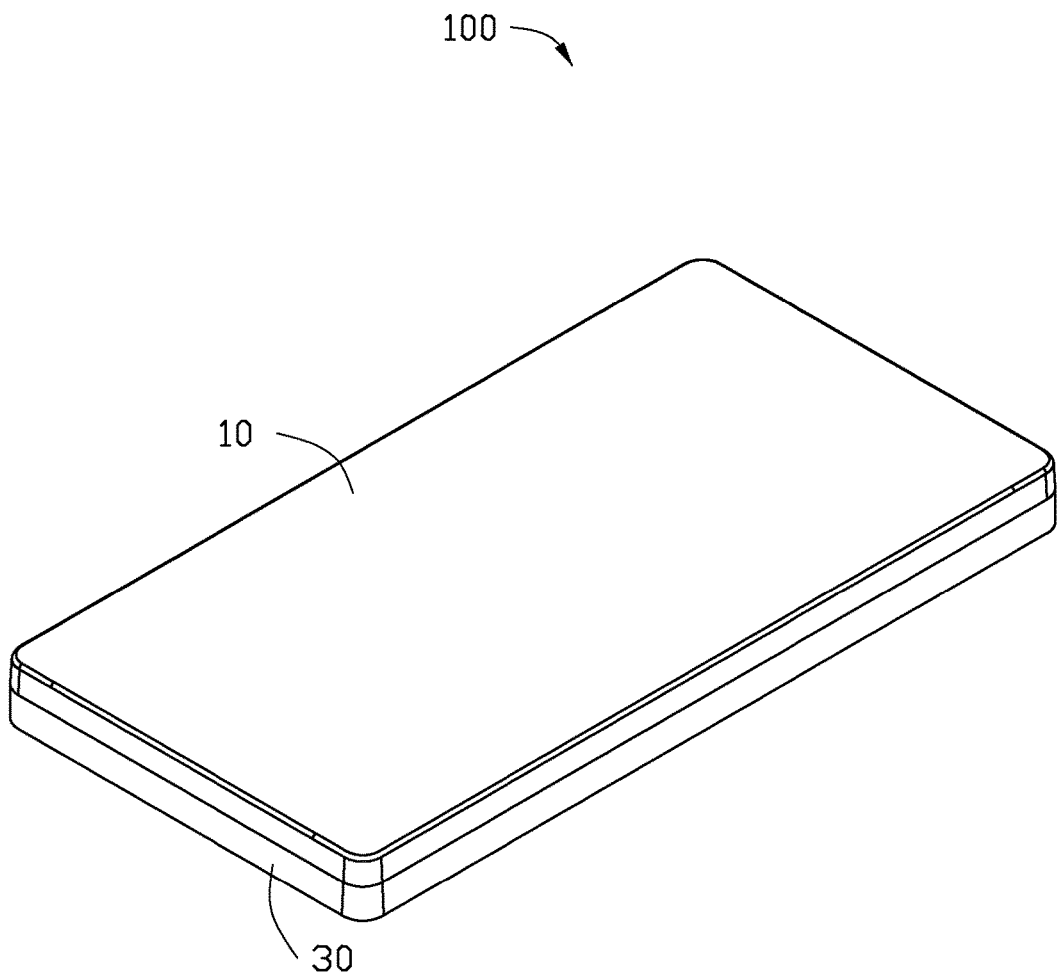
FIG. 1 is an isometric view of an electronic device, according to an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 illustrates an electronic device 100 according to an exemplary embodiment. The electronic device 100 can be, but not limited to, a mobile phone, a personal digital assistant or a tablet computer. The electronic device 100 includes a housing 10 and a body 30 assembled to the housing 10.

The electronic device 100 can further include a printed circuit board (not shown) and a battery (not shown) located in the body 30. The battery is electronically connected with the PCB.

Figure 2:
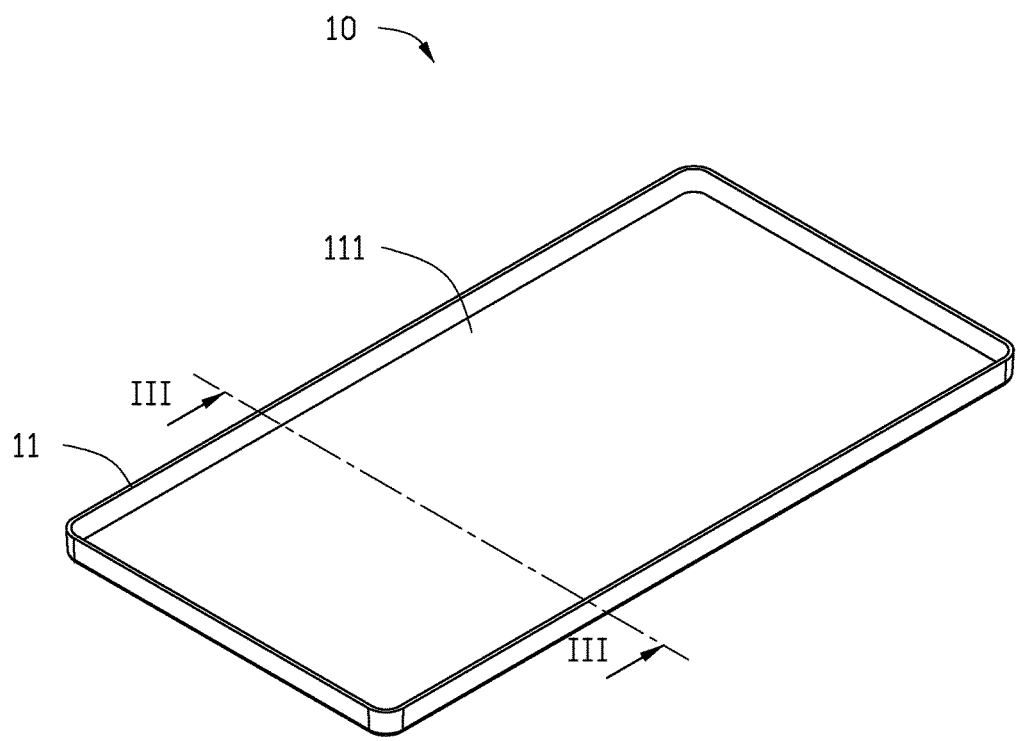
FIG. 2 is an isometric view of a housing of the electronic device shown in FIG. 1 according to an exemplary embodiment.
Figure 3:
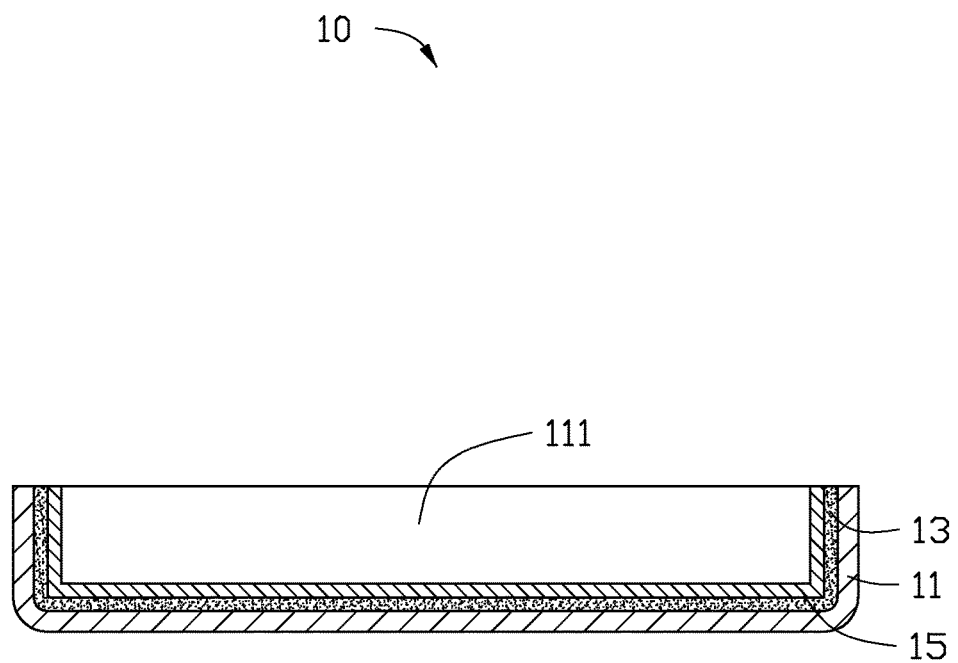
FIG. 3 is a cross-sectional view of the housing along line III-III of FIG. 2.

Referring to FIG. 2 and FIG. 3, the housing 10 includes a metal substrate 11 and an adhesive layer 13 formed on the metal substrate 11, a resin film 15 formed on the adhesive layer 13. The resin film 15 can strongly bond with the metal substrate 11 through the adhesive layer 13. In the exemplary, the resin film 15 and the adhesive layer 13 can both have shapes corresponding to the metal substrate 11.

The metal substrate 11 has a thickness of about 0.4 mm to about 0.8 mm. The metal substrate 11 can be made of stainless steel, iron, aluminium, aluminium alloy, copper, copper alloy, titanium, titanium alloy, magnesium or magnesium alloy. In at least one exemplary embodiment, the metal substrate 11 can be sheet-shaped.

The adhesive layer 13 can be made of a UV curing paint, and has a thickness of between about 0.05 mm to about 0.1 mm. The adhesive layer 13 has good toughness.

The resin film 15 can be made of a polycarbonate (PC), a polyethylene terephthalate (PET), a polybutylene terephthalate (PBT), a polymethylmethacrylate (PMMA) or a polylactide (PLA). The resin film 15 has a thickness of between about 0.05 mm to about 0.2 mm. The resin film 15 also has good toughness. In at least one exemplary embodiment, the resin film 15 is transparent.

The metal substrate 11 having the resin film 15 and the adhesive layer 13 can form a cavity 111 through a stamping process. During the stamping process, the metal substrate 11, the adhesive layer 13 and the resin film 15 can be deformed to form the cavity 111 having a desired shape of the electronic device 100. As the resin film 15 and the adhesive layer 13 both have good toughness, the resin film 15 and the adhesive layer 13 can strongly bond with the metal substrate 11 during the deforming process. The deformed metal substrate 11, the deformed adhesive layer 13, and the deformed resin film cooperatively form the cavity 111.

The cavity 111 can receive an internal structure (not shown) formed by an injection process. The internal structure can be formed on the resin film 15. The internal structure has desired shape needed by the electronic device 100.

The internal structure can be made of a polycarbonate (PC), a polyethylene terephthalate (PET), a polybutylene terephthalate (PBT), a poly(p-phenylene sulfide) (PPS), a plyamide (PA), a polypropylene (PP), an acrylonitrile butadiene styrene copolymers (ABS), a thermoplastic polyurethane (TPU), or a poly 1,4-cyclohexylene dimethylene terephthalate (PCT).

Figure 4:
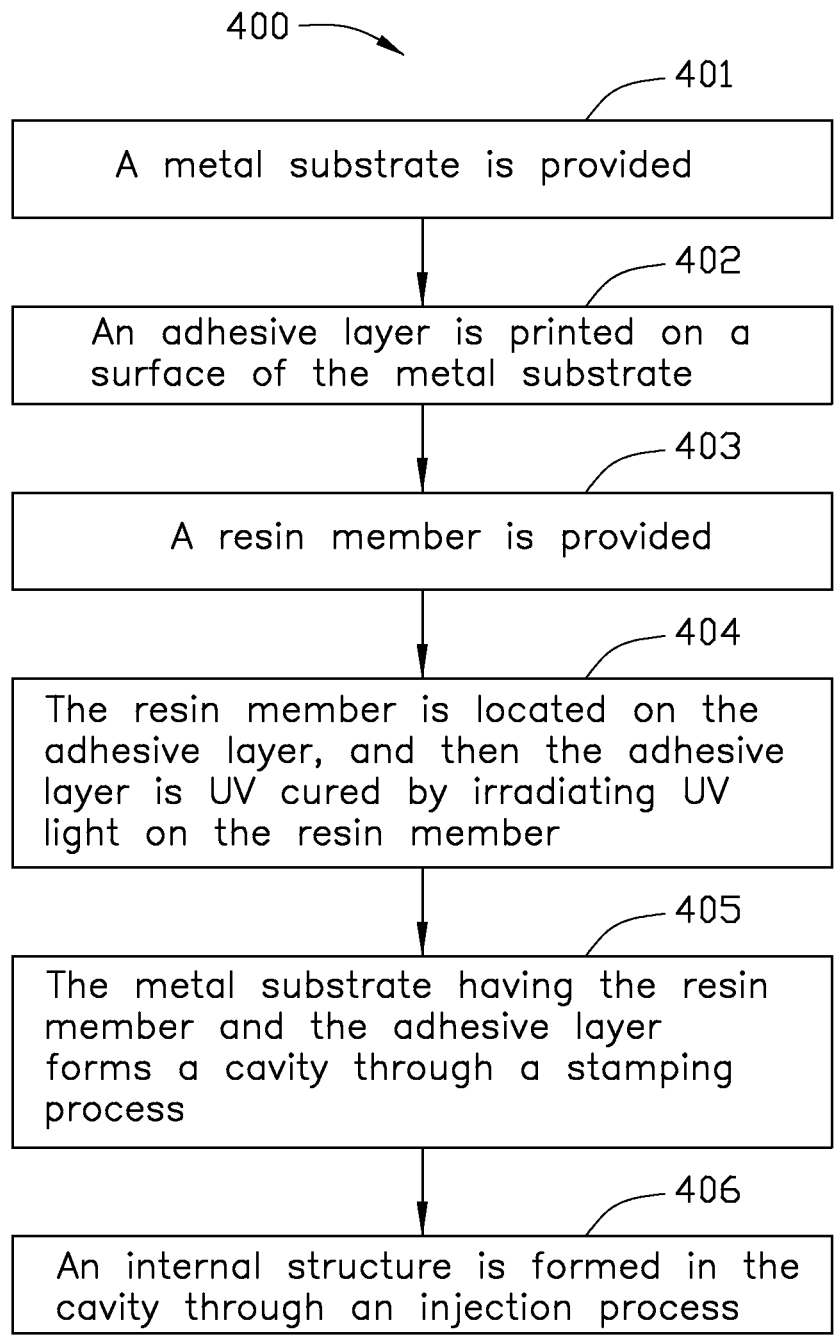
FIG. 4 is a flow chart of a method for making a housing in accordance with an exemplary embodiment.

Referring to FIG. 4, a flowchart is presented in accordance with an example embodiment. The method 400 is provided by way of example, as there are a variety of ways to carry out the method. The method 400 described below can be carried out using the configurations illustrated in FIGS. 1-3, for example, and various elements of these figures are referenced in explaining method 400. Each block shown in FIG. 4 represents one or more processes, methods or subroutines, carried out in the example method 400. Furthermore, the order of blocks is illustrative only and the order of the blocks can change according to the present disclosure. Additional blocks can be added or fewer blocks can be utilized, without departing from this disclosure. The method 400 for making the housing 10 can begin at block 401.

At block 401, a metal substrate 31 is provided. The metal substrate 11 has a thickness of between about 0.4 mm to about 0.8 mm. The metal substrate 11 can be made of a metal which can be selected from a group consisting of stainless steel, iron, aluminium, aluminium alloy, copper, copper alloy, titanium, titanium alloy, magnesium or magnesium alloy. In at least one exemplary embodiment, the metal substrate 11 can be sheet-shaped.

At block 402, an adhesive layer 13 is printed on a surface of the metal substrate 11. The adhesive layer 13 can be made of a UV curing paint, and have a thickness of between about 0.05 mm to about 0.1 mm. The adhesive layer 13 has good toughness.

At block 403, a resin film 15 is provided. In at least one exemplary embodiment, the resin film 15 is transparent. The resin film 15 can be made of resin which can be selected from a group consisting of polycarbonate (PC), polyethylene terephthalate (PET), polybutylene terephthalate (PBT), polymethylmethacrylate (PMMA) or polylactide (PLA). The resin film 15 has a thickness of between about 0.05 mm to about 0.2 mm. The resin film 15 also has good toughness.

At block 404, the resin film 15 is located on the adhesive layer 13, and the adhesive layer 13 can be UV cured by irradiating UV light on the resin film 15, UV light can pass through the transparent resin film 15 and cure the adhesive layer 13. The UV curing process can last for about 5 seconds to about 20 seconds. The resin film 15 can strongly bond with the metal film 11 through the adhesive layer 13.

At block 405, the metal substrate 11 having the resin film 15 and the adhesive layer 13 can form a cavity 111 through a stamping process. During the stamping process, the metal substrate 11, the adhesive layer 13 and the resin film 15 can be deformed to form the cavity 111 having a desired shape of the electronic device 100. As the resin film 15 and the adhesive layer 13 both have good toughness, the resin film 15 and the adhesive layer 13 can strongly bond with the metal substrate 11 during the deforming process. The deformed metal substrate 11, the deformed adhesive layer 13, and the deformed resin film cooperatively form the cavity 111.

At block 406, an internal structure (not shown) is formed in the cavity 111 through an injection process. The injection process can be carried out by locating the metal substrate into a mold (not shown), and molding molten resin having a temperature of about 250-275° C. into the mold to form the internal structure needed by the electronic device 100. The internal structure can be formed and received in the cavity 111. The internal structure can be formed on the resin film 15. The mold has a temperature of about 140° C. to about 145° C., an injection pressure of about 1300 bar to about 1700 bar, and an injection speed of about 85 mm/s to about 105 mm/s. The molten resin should be maintained at a pressure of about 1350-1450 bar for about 1 second to about 2 seconds. The internal structure can be made of a resin which can be selected from a group consisting of polycarbonate (PC), polyethylene terephthalate (PET), polybutylene terephthalate (PBT), poly(p-phenylene sulfide) (PPS), plyamide (PA), polypropylene (PP), acrylonitrile butadiene styrene copolymers (ABS), thermoplastic polyurethane (TPU), or poly 1,4-cyclohexylene dimethylene terephthalate (PCT).

It is to be understood, however, that even through numerous characteristics and advantages of the present disclosure have been set forth in the foregoing description, together with details of assembly and function, the disclosure is illustrative only, and changes may be made in detail, including in the matters of shape, size, and arrangement of parts within the principles of the disclosure to the full extent indicated by the broad general meaning of the terms in which the appended claims are expressed.

What is claimed is:

1. A housing comprising:
    a metal substrate;
    an adhesive layer formed on the metal substrate, wherein the adhesive layer is made of UV curing paint and has a thickness of between 0.05 mm to 0.1 mm; and
    a resin film formed on the adhesive layer, the metal substrate, the adhesive layer and the resin film cooperatively forming a cavity through a stamping process, an internal structure being formed in the cavity through an injection process, and the internal structure being formed on the resin film.

2. The housing as claimed in claim 1, wherein the metal substrate has a thickness of between 0.4 mm to 0.8 mm.

3. The housing as claimed in claim 1, wherein the metal film is made of stainless steel, iron, aluminium, aluminium alloy, copper, copper alloy, titanium, titanium alloy, magnesium, or magnesium alloy.

4. The housing as claimed in claim 1, wherein the resin film is made of polycarbonate, polyethylene terephthalate, polybutylene terephthalate, polymethylmethacrylate or polylactide.

5. The housing as claimed in claim 1, wherein the resin film is transparent, and has a thickness of between 0.05 mm to 0.2 mm.

6. The housing as claimed in claim 1, wherein the internal structure is made of polycarbonate, polyethylene terephthalate, polybutylene terephthalate, poly(p-phenylene sulfide) plyamide, polypropylene, acrylonitrile butadiene styrene copolymers, thermoplastic polyurethane, or poly 1,4-cyclohexylene dimethylene terephthalate.

7. A method of making a housing comprising:
    providing a metal substrate;
    printing an adhesive layer on a surface of the metal substrate;
    locating a resin film on a surface of the adhesive layer, and irradiating UV light on the resin film to cure the adhesive layer;
    the metal substrate having the adhesive layer and the resin film being stamped to form a cavity, the metal substrate, the adhesive layer and the resin film cooperatively forming the cavity; and
    locating the metal substrate a mold, molding molten resin into the mold to form an internal structure received in the cavity, and the internal structure being formed on the resin film.

8. The method of making a housing as claimed in claim 7, wherein the during the stamping process, the metal substrate, the adhesive layer and the resin film are deformed, the resin film and the adhesive layer bond with the metal substrates during the stamping process, the deformed metal substrate, the deformed adhesive layer, and the deformed resin film cooperatively form the cavity.

9. The method of making a housing as claimed in claim 7, wherein the UV light passes through the resin film to cure the adhesive layer, the resin film bonds with the metal substrate through the adhesive layer.

10. An electronic device comprising:
    a body; and
    a housing assembled to the body, the housing having:
        a metal substrate;
        an adhesive layer formed on the metal substrate, wherein the adhesive layer is made of UV curing paint and has a thickness of between 0.05 mm to 0.1 mm; and
        a resin film formed on the adhesive layer, the metal substrate, the adhesive layer and the resin film cooperatively forming a cavity through a stamping process, an internal structure being formed in the cavity through an injection process, and the internal structure being formed on the resin film.

11. The electronic device as claimed in claim 10, wherein the metal substrate has a thickness of between 0.4 mm to 0.8 mm.

12. The electronic device as claimed in claim 10, wherein the metal film is made of stainless steel, iron, aluminium, aluminium alloy, copper, copper alloy, titanium, titanium alloy, magnesium, or magnesium alloy.

13. The electronic device as claimed in claim 10, wherein the resin film is made of polycarbonate, polyethylene terephthalate, polybutylene terephthalate, polymethylmethacrylate or polylactide.

14. The electronic device as claimed in claim 10, wherein the resin film is transparent, and has a thickness of between 0.05 mm to 0.2 mm.

15. The electronic device as claimed in claim 10, wherein the internal structure is made of polycarbonate, polyethylene terephthalate, polybutylene terephthalate, poly(p-phenylene sulfide) plyamide, polypropylene, acrylonitrile butadiene styrene copolymers, thermoplastic polyurethane, or poly 1,4-cyclohexylene dimethylene terephthalate.

16. The electronic device as claimed in claim 10, wherein the electronic device further includes a PCB and a battery located, the battery is electronically connected with the PCB.

* * * * *